United States Patent [19]

Morin et al.

[11] Patent Number: 5,430,386
[45] Date of Patent: Jul. 4, 1995

[54] METHOD AND APPARATUS FOR EVALUATING SEMICONDUCTOR WAFERS BY IRRADIATION WITH MICROWAVE AND EXCITATION LIGHT

[75] Inventors: Michel Morin, Tsukuba; Jean Friedt, Funakaware; Yasuhide Nakai, Kobe; Hidehisa Hashizume; Chiyo Fujihira, both of Hyogo; Masatake Hirose, Hiroshima, all of Japan

[73] Assignees: Leo Corporation, Tokyo, Japan; L'Air Liquide, Societe Anonyme Pour L'Etude Et L'Exploitation Des Procedes Georges Claude, Paris Cedex, France

[21] Appl. No.: 12,405

[22] Filed: Feb. 2, 1993

[30] Foreign Application Priority Data

Feb. 3, 1992 [JP] Japan .................. 4-017649

[51] Int. Cl.$^6$ ............................. G01R 31/26
[52] U.S. Cl. .................. 324/765; 324/767; 324/750
[58] Field of Search ............ 324/158 R, 73.1, 719, 324/158 T, 158 D, 765, 767, 750; 437/8; 257/40

[56] References Cited

U.S. PATENT DOCUMENTS

| | | | |
|---|---|---|---|
| 4,839,588 | 6/1989 | Jantsch et al. | 324/158 D |
| 5,020,476 | 6/1991 | Bay et al. | |
| 5,047,713 | 9/1991 | Kirino et al. | 324/158 R |
| 5,049,816 | 9/1991 | Moslehi | 324/158 T |
| 5,153,503 | 10/1992 | Yahata | 324/158 D |

OTHER PUBLICATIONS

Chemical Abstracts, vol. 115, No. 4, Jul. 29, 1991, Sumiya Hiroshi, et al., "Manufacture of Semiconductor Wafers by Vapor Phase Epitaxy", p. 678, AN 39132n.
The Physical Review, vol. 87, No. 5, Sep. 1, 1952, R. N. Hall, "Electron-Hole Recombination in Germanium", p. 387.
The Physical Review, vol. 87, No. 5, Sep. 1, 1952, W. Shockley, et al., "Statistics of the Recombinations of Holes and Electrons", pp. 835-842.

Primary Examiner—Vinh Nguyen
Attorney, Agent, or Firm—Oblon, Spivak, McClelland, Maier, & Neustadt

[57] ABSTRACT

Method and its device for evaluating semiconductor wafers that evaluates semiconductor wafers by estimating the dopant level which is equivalent to the critical value at which the excess minority carrier injection density reaches the high injection state, and that measures the minority carrier lifetime at a low-injection-state exposure condition adapted to said dopant level. Excitation light (emitted by excitation light generator 4) is emitted onto a semiconductor wafer 2 at varying exposure conditions as imposed by an exposure condition controller 9. Detector 6 detects the change in the level of reflected radiation from microwaves emitted by microwave generator 5 onto the wafer 2. The dopant level in the semiconductor wafer 2 is estimated by estimation circuit 10' based on the change in the exposure conditions and the change in the minority carrier lifetime as determined by the change in the microwave level. The minority carrier lifetime is measured by measurement circuit 12 at the exposure condition adapted to said dopant level as detected by exposure condition detection circuit 11. This structure makes possible the estimation of the dopant level in the semiconductor wafer while obtaining the lifetime based on Shockley-Read-Hall statistics, and is thus highly qualified for evaluating the semiconductor wafer 2.

12 Claims, 8 Drawing Sheets

| WAFER NUMBER | TYPE | POINT A CARRIER INJECTION DENSITY DOPANT LEVEL C |
|---|---|---|
| 1 | N | 1.0 |
| 2 | N | 0.7 |
| 3 | N | 0.75 |
| 4 | N | 0.375 |
| 5 | P | 0.2 |
| 6 | P | 0.2 |
| 7 | P | 0.3 |
| 8 | P | 0.08 |

METHOD AND APPARATUS FOR EVALUATING SEMICONDUCTOR WAFERS BY IRRADIATION WITH MICROWAVE AND EXCITATION LIGHT

BACKGROUND OF THE INVENTION

The present invention relates to a method for evaluating semiconductor wafers and to a device for use therein. More specifically, the present invention relates both to a method and its device for estimating the dopant level in semiconductor wafers and to a method and its device for measuring the lifetime in semiconductor wafers.

The recent trend toward ultrahigh levels of accuracy in semiconductor devices, as typified by ultralarge-scale integration, requires that the semiconductor wafers used for this purpose be subjected to an ever more rigorous quality control.

In achieving this control, it is highly desirable that semiconductor wafer evaluation be carried out by a noncontact measurement method that does not risk contaminating or damaging the semiconductor wafer. An example of such a method is the use of microwaves to measure semiconductor properties.

FIG. 1 contains a block diagram of the measurement principle for one example of the prior art devices for measuring semiconductor properties. FIG. 2 contains an input/output time chart of this device for measuring semiconductor properties. FIG. 3 contains a graph of the relationship between semiconductor wafer resistivity and the variation in the value of the microwave detection current. FIG. 4 contains an attenuation curve as displayed on a synchroscope.

As demonstrated on FIG. 1, the prior device A for measurement of semiconductor properties is constituted of the following: a sample support 1, an excitation light generator 4 that generates excitation light that is emitted onto a semiconductor wafer 2 (measurement sample) held on sample support 1, a microwave generator 5 that generates microwaves that are emitted onto semiconductor wafer 2, a waveguide 3 that conducts the microwaves from microwave generator 5 onto semiconductor wafer 2, a detector 6 that detects (via waveguide 3) the microwaves reflected from the surface of the semiconductor wafer 2, a synchroscope 7 that displays the microwave level variation as detected by the detector 6, and a control circuit 4 that controls excitation light generator 4, microwave generator 5, detector 6, and synchroscope 7.

The corresponding measurement principle is explained below with reference to FIG. 2.

A known microwave level b generated by the microwave generator 5 is emitted from the emitter tip of waveguide 3 onto the surface of semiconductor wafer 2. A light pulse a, of known level, width, and interval, is generated by excitation light generator 4 and is emitted as excitation light onto the surface of the semiconductor wafer 2 that is also receiving microwave radiation b, thereby exciting the carriers (free electron and positive hole pairs) within the semiconductor wafer 2. Since the majority carrier is originally present in the semiconductor wafer 2 in very large numbers, it undergoes only a relatively small change in concentration due to exposure to this excitation light. However, the minority carrier undergoes a substantial change in concentration, and the properties of the semiconductor wafer 2 can be very accurately detected by detecting the change in the minority carrier concentration. Thus, the discussion that follows will generally focus on the minority carrier.

Because the minority carriers excited as above represent an excess over the carrier concentration when semiconductor wafer 2 is at thermal equilibrium, the minority carrier concentration d increases.

Then, between pulses (interruption in photoexposure), these excess carriers recombine and their population gradually declines. As a result, the minority carrier concentration d also gradually declines until it reaches the level at thermal equilibrium.

The exponential function $\exp(-t/\pi)$ governs the time required for restoration of the thermal equilibrium condition after this type of displacement of the minority carrier from thermal equilibrium (t=time elapsed from cessation of photoexposure). The parameter T is called the minority carrier lifetime, and it is one of the parameters that can represent the impurity concentration in a semiconductor wafer.

Due to the change in electrical conductivity (i.e., resistivity) in semiconductor wafer 2 that accompanies the change in minority carrier concentration d, the relationship depicted in FIG. 4 obtains between the resistivity and the detection current value. This detection current value corresponds to changes in the level of the microwave radiation that has been emitted onto the semiconductor wafer 2. After the level change, the reflected microwave radiation c (reflected by the surface of the semiconductor wafer 2) again passes through waveguide 3 and travels to detector 6. The microwave (reflected wave) attenuation detected by synchroscope 7 is expressed by an attenuation curve, for example, as in FIG. 4.

The level of impurities such as, for example, heavy metals, in semiconductor wafer 2 can be evaluated from measurement of the minority carrier lifetime based on this attenuation curve.

In the above-described microwave-based method for measuring semiconductor properties, the detection accuracy for the change in microwave level is reduced when the carrier injection density (corresponds to the exposure) is reduced at the point of production of the excess minority carriers by exposing semiconductor wafer 2 to the excitation light.

In other words, a diminution in the carrier injection density also diminishes the magnitude of the variation in minority carrier concentration between the thermal equilibrium and injection states. Due to this, the level change in the reflected microwaves becomes smaller, the S/N ratio is diminished, and the detection accuracy is reduced.

For this reason, based on considerations of the detection accuracy of the device A for measuring semiconductor properties, the carrier injection density in prior measurement methods has been established taking into account a safety factor with respect to the detection limit.

The semiconductor characteristics are then evaluated by measuring the minority carrier lifetime while fixed at the carrier injection density established on the preceding basis.

However, when the carrier injection density is established at a high injection state at or above some specified value, the injected carrier density can become dominant or controlling, with the result that the density values for the majority carrier and minority carrier within semiconductor wafer 2 become approximately equal. This generates a carrier migration phenomenon known as bipolar diffusion. Bipolar diffusion substantially affects minority carrier lifetime. In addition to this bipolar diffusion, the following nonlinear phenomena are produced at high injection states: variations in the diffusion constant (indicates the relationship between carrier migration distance {diffusion path} and carrier lifetime), Auger recombination in which recombination of electron-positive hole pairs occurs by a phenomenon other than the aforementioned photoexcitation recombination, and saturation of the occupied states of the recombination centers by excess carriers. Due to the complex interactions among these phenomena, the risk arises that the measured minority carrier lifetime will differ from the native minority carrier lifetime as derived from the known theoretical equation according to Shockley-Read-Hall statistics [W. Shockley and W. T. Read, Phys. Rev., 87, 835 (1952); R. N. Hall, Phys. Rev., 87, 387 (1952)]. As a result, the semiconductor wafer 2 may not be accurately evaluated in some cases.

Furthermore, the change in the microwave level extends into the nonlinear segment of the microwave detection curve at high injection states, and this creates additional risk of error in measurement of the minority carrier lifetime.

SUMMARY OF THE INVENTION

The present invention was developed in order to solve the problems associated with the prior art as discussed above. The first object of the present invention lies in the introduction of a method and its device for estimating the dopant level in semiconductor wafers that estimates the dopant level which is the initially occurring impurity concentration in p-type and n-type semiconductors and which is equivalent to the critical value at which the excess minority carrier injection density enters the high injection state.

A second object of the present invention is the introduction of a method and its device for measuring the lifetime in semiconductor wafers that measures the minority carrier lifetime at a low-injection-state exposure condition that is adapted to the aforesaid dopant level.

The present invention essentially comprises a method and its device for estimating the dopant level in semiconductor wafers in which the semiconductor wafer is exposed to excitation light under different exposure conditions while detecting the transmitted or reflected radiation from microwaves irradiated onto the semiconductor wafer, and in which the dopant level in the semiconductor wafer is estimated based on the aforesaid variation in exposure conditions and the change in the minority carrier lifetime as determined from the change in the microwave level.

In addition, this includes a method and its device for estimating the dopant level in semiconductor wafers, in which said dopant level is estimated to be equivalent to the injection density that is approximately 0.8 to 20 times the minority carrier injection density that corresponds to the photoexcitation dosage at the point at which an increase first appears in the course of the variation in the minority carrier lifetime in the semiconductor wafer which accompanies the aforesaid variation in exposure conditions.

The principal means employed in the present invention to achieve the aforesaid second object essentially comprises a method and its device for measuring the lifetime in semiconductor wafers in which the semiconductor wafer is exposure to excitation light at varying exposure conditions while detecting the transmitted or reflected radiation from microwaves irradiated onto the semiconductor wafer. Based on this variation in exposure conditions and the variation in the minority carrier lifetime as determined from the change in microwave level, an exposure condition is detected that is adapted to the dopant level in the semiconductor wafer. The minority carrier lifetime in the semiconductor wafer is then measured at the aforesaid dopant level-adapted exposure condition.

This includes a method and its device for measuring the lifetime in semiconductor wafers in which the aforesaid dopant level-adapted exposure condition is taken as equivalent to the injection density that is approximately $\leq 0.5$ times the minority carrier injection density that corresponds to the photoexcitation dosage at the point at which an increase first appears in the course of the variation in the minority carrier lifetime in the semiconductor wafer which accompanies the aforesaid variation in exposure conditions.

This also includes a device for estimating the dopant level in semiconductor wafers and a device for measuring the lifetime in semiconductor wafers wherein a variation means capable of varying the exposure conditions is installed in said devices between the semiconductor wafer and the exposure means that emits the excitation light and wherein said variation means comprises a regulatory means capable of interrupting and/or attenuating the excitation light emitted from said exposure means.

Also included herein is a device for estimating the dopant level in semiconductor wafers and a device for measuring the lifetime in semiconductor wafers wherein there is installed in said devices, between the semiconductor wafer and the exposure means that emits the excitation light, a regulatory means that is capable of interrupting and/or attenuating the excitation light already emitted at varying exposure conditions due to the action of the aforesaid variation means capable of varying the exposure conditions.

Also included herein is a device for estimating the dopant level in semiconductor wafers and a device for measuring the lifetime in semiconductor wafers wherein said devices contain a beam-size-regulatory means that can make the size of the beam of excitation light (from the exposure means that emits the excitation light) approximately equal to the area of the microwave emitter tip of the emission means that emits the microwaves.

According to the method and its device of the present invention for estimating the dopant level in semiconductor wafers, the semiconductor wafer is exposed to excitation light using various exposure conditions and is also irradiated with microwaves, and the reflected or transmitted microwave radiation is detected. The dopant level in the semiconductor wafer is estimated based on the aforesaid change in exposure conditions and the change in the minority carrier lifetime as determined from the change in the microwave level.

As a result, the critical value can be estimated at which the excess minority carrier injection density reaches a high injection state.

In addition, according to the method and its device of the present invention for measuring the lifetime in semiconductor wafers, the semiconductor wafer is exposed to excitation light using various exposure conditions, and the microwave radiation originating from that irradiated onto the semiconductor wafer is detected. An exposure condition that is adapted to the dopant level in the semiconductor wafer is detected based on the aforesaid change in exposure conditions and the change in the minority carrier lifetime as determined from the change in microwave level. By detecting the microwave radiation while carrying out exposure to the excitation light at a low-injection-state exposure condition adapted to said dopant level, the minority carrier lifetime in the semiconductor wafer can be measured at an optimal injection density.

This makes it possible to reliably determine the minority carrier lifetime that corresponds to the impurity concentration based on Shockley-Read-Hall statistics. As a consequence, semiconductor wafers can be more accurately evaluated than in the example from the prior art.

In support of a thorough comprehension of the present invention, the present invention is explained hereinafter through specific examples with reference to the attached drawings. The following examples are merely individual specific examples of the present invention and should not be construed as limiting the technical scope of the present invention.

Figure 5A:
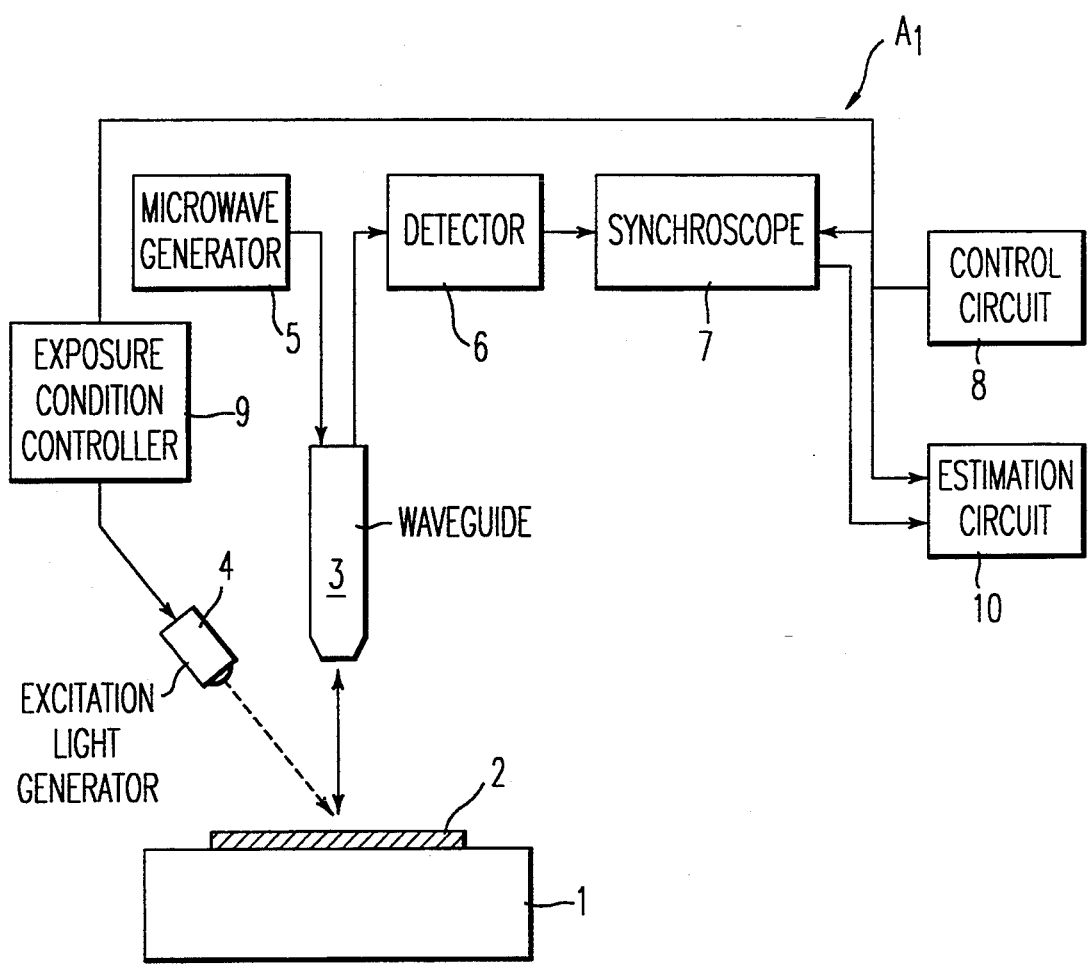
FIG. 5A and B describe schematic drawings of two different embodiments of a device according to the invention.
Figure 5B:
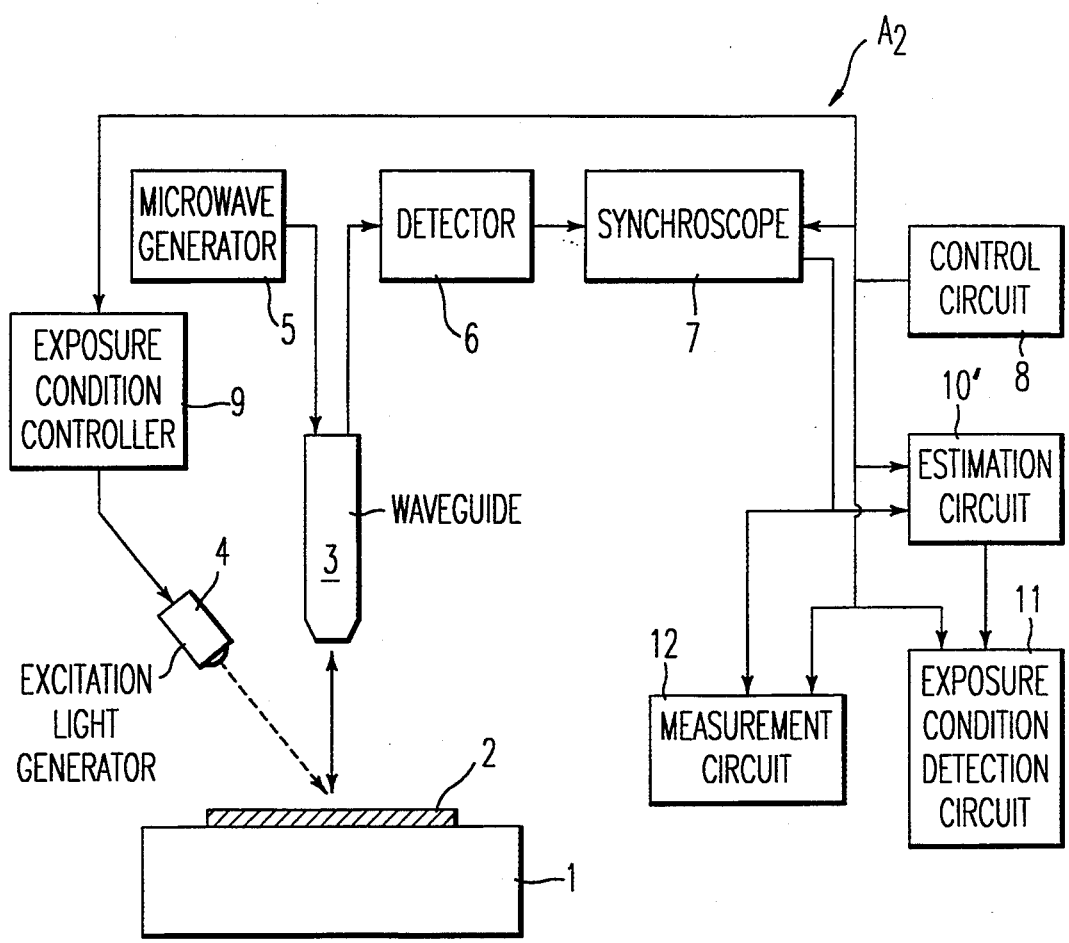

FIG. 5A contains a block diagram that presents the measurement principle for a device for measuring semiconductor properties in accordance with a first example of the present invention. FIG. 5B contains a block diagram that presents the measurement principle for a device for measuring semiconductor properties in accordance with a second example of the present invention.

Figure 6:
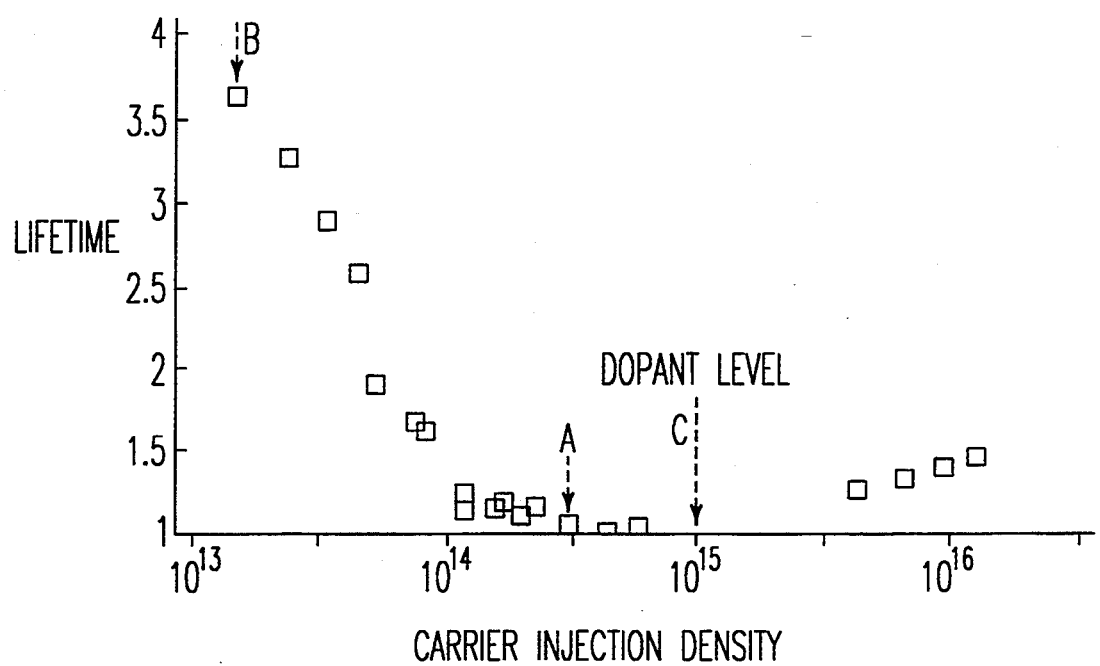

FIG. 6 describes a graph that shows the relationship between carrier injection density and lifetime.

Figures 7, 8:
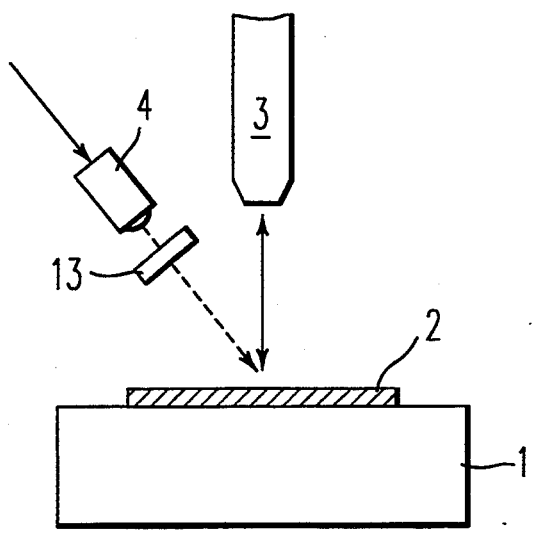

FIG. 7 reports the experimental results for various types of semiconductor wafers for the following ratio: injection density at point A/dopant level.

FIG. 8 is a block diagram that relates to another example concerning the region in the vicinity of the excitation light generator.

Figure 9A:
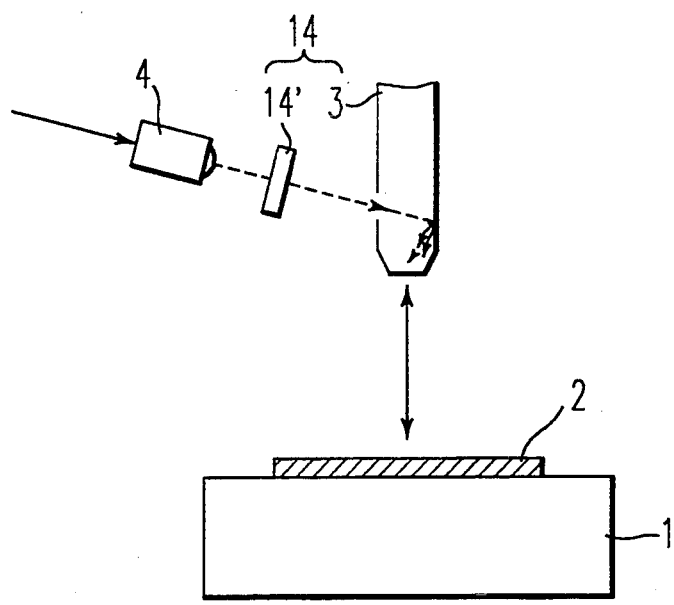
Figure 9B:
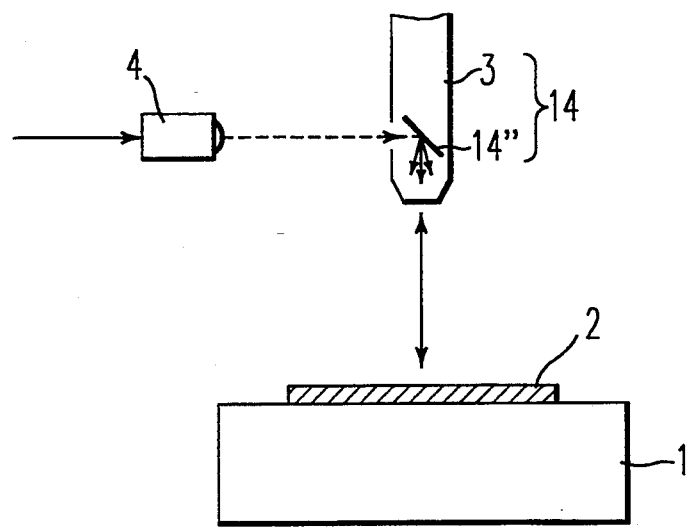

FIG. 9a–9b are block diagrams that relates to another example concerning the region in the vicinity of the microwave waveguide.

Figure 1:
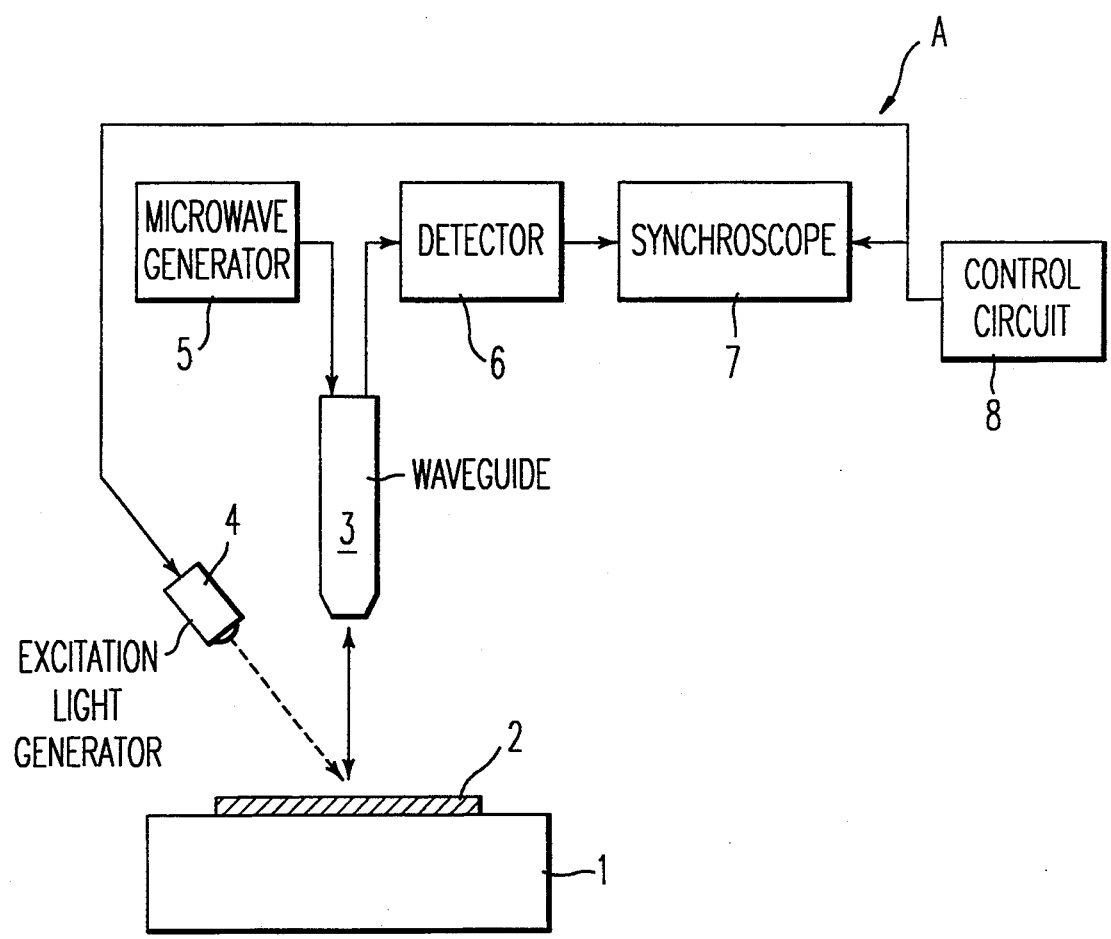
FIG. 1 contains a block diagram of the measurement principle for one example of the prior art devices for measuring semiconductor properties.
Figure 2:
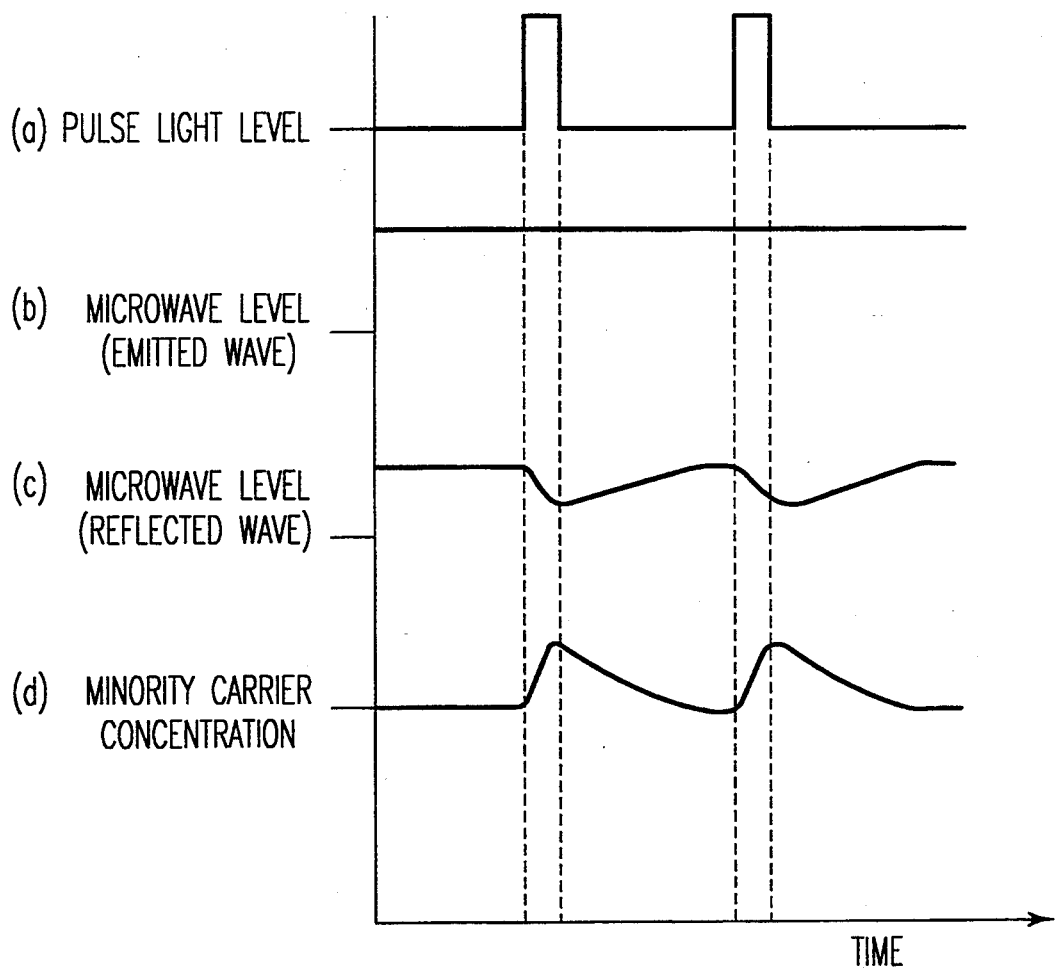
FIG. 2 contains an input/output time chart of this device for measuring semiconductor properties.
Figure 3:
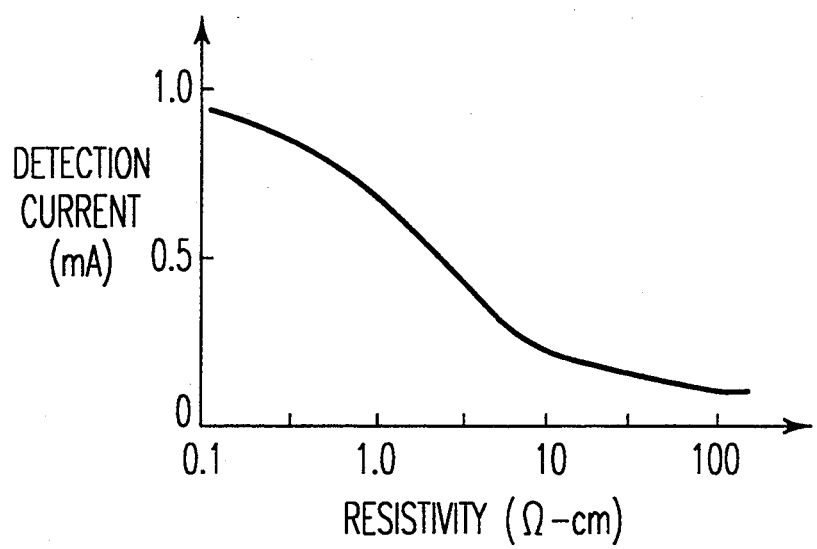
FIG. 3 contains a graph of the relationship between semiconductor wafer resistivity and the variation in the value of the microwave detection current.
Figure 4:
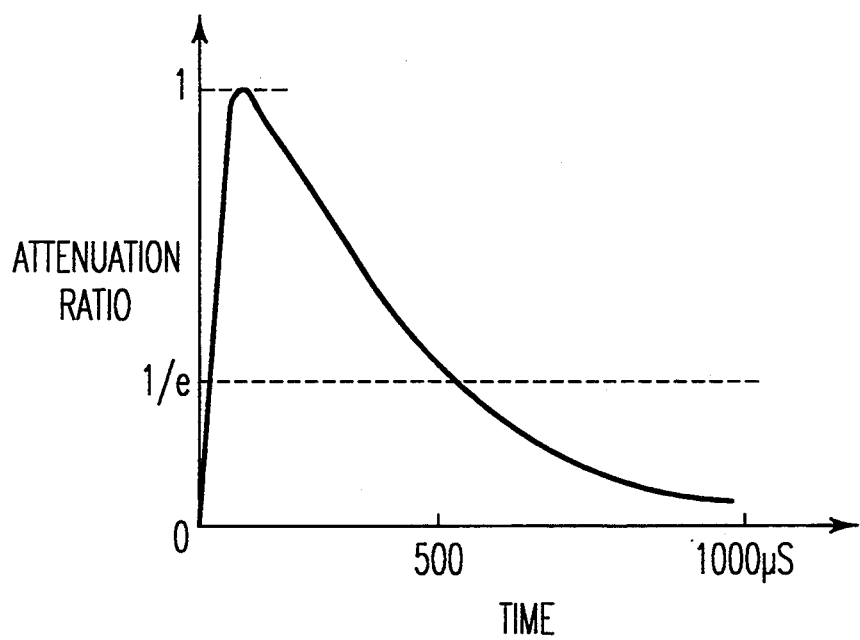
FIG. 4 contains an attenuation curve as displayed on a synchroscope.

On those figures, the same numbers are used for those elements in common with the elements in the block diagram in FIG. 1 (block diagram of the measurement principle for one example of a prior art device for measuring semiconductor properties).

DETAILED DESCRIPTION OF THE INVENTION

Considering first the device $A_1$ for measuring semiconductor properties in accordance with the first example, as demonstrated in FIG. 5A this device $A_1$ is equipped with the following elements as in the prior art example: sample support 1, semiconductor wafer 2, excitation light generator 4 as one example of the exposure means, microwave generator 5 as one example of the emission means, waveguide 3, detector 6 as one example of the detection means, and synchroscope 7. In addition, device $A_1$ is also equipped with the following: an exposure condition controller 9 that is one example of the variation means for varying the excitation light's exposure conditions, and an estimation circuit 10 that is one example of the estimation means for estimating the dopant level in semiconductor wafer 2.

The measurement principle will now be explained in detail below with reference to FIGS. 6 and 7. This discussion omits a detailed explanation for those elements identical with the prior art since this has already been done above.

Microwaves b, emitted at a known level by microwave generator 5, are emitted onto the surface of semiconductor wafer 2 by waveguide 3. Exposure condition controller 9 varies the exposure conditions, i.e., the pulse strength, pulse width, or pulse interval of the light pulse, individually or in combination, during exposure of the wafer surface to the excitation light output, e.g., the light pulse, from excitation light generator 4.

FIG. 6 reports the correlation between the variation in carrier injection density and the variation in minority carrier lifetime as determined from the results of such experiments.

For a semiconductor wafer with an already known dopant level (point C), as the carrier injection density gradually declines from the high injection state, the minority carrier lifetime first declines in that region and then begins to increase (point A).

FIG. 7 reports examples of the density ratio between point A and point C as measured for 8 types of semiconductor wafers: the range for the A/C ratio (=ratio between carrier injection densities at points A and C) falls within the range of approximately 1.2 to 0.05.

Furthermore, when in FIG. 6 the carrier injection density reaches approximately $\leq 0.5$ times point A, the minority carrier lifetime becomes saturated and no longer increases (point B).

Accordingly, it can be understood from FIG. 6 that measurement at carrier densities between point B and point C is conducted at a low injection state that is free of high-injection-state factors that impede measurement of the native minority carrier lifetime, e.g., bipolar diffusion, changes in the diffusion coefficient, Auger recombination, saturation of occupied states at recombination centers by high injection carriers, nonlinearity of the microwave detection curve, and so forth.

This first example was implemented by considering the correlation between the change in carrier injection density and the change in minority carrier lifetime as described above. In other words, the minority carrier lifetime is measured at each different exposure condition (injection density) for the excitation light as imposed by exposure condition controller 9. This results in detection of the point (point A) at which the lifetime begins to increase as the injection density declines, and the dopant level in the semiconductor wafer 2 is estimated based on the injection density at this point A. Estimation circuit 10 manages this series of processes.

The dopant level can be obtained by multiplying the injection density at point A by approximately 0.8 to 20 (reciprocal of the above-described A/C).

The device $A_2$ for measuring semiconductor properties according to the second example will now be taken up (see FIG. 5B). In addition to the structures present in the first example, device $A_2$ is also equipped with an exposure condition detection circuit 11, which is one example of an exposure condition detection means that detects the exposure condition adapted to the dopant level in the semiconductor wafer, and with a measurement circuit 12 that is one example of a lifetime measurement means that measures the minority carrier lifetime in semiconductor wafer 2 at the exposure condition detected by exposure condition detection circuit 11.

With respect to the estimation circuit 10' in this second example, functionality simply to the detection of point A is sufficient.

In this example, the optimal low-injection-state exposure condition is detected by exposure condition detection circuit 11 based on the injection density at point A as detected by estimation circuit 10'. The minority carrier lifetime is measured by measurement circuit 12 using carrier injection into semiconductor wafer 2 at the exposure condition detected in this manner.

The minority carrier lifetime measured in this manner is the minority carrier lifetime based on Shockley-Read-Hall statistics due to impurity alone, and those factors discussed hereinbefore that can impair measurement of the native lifetime are eliminated.

Accordingly, the impurity level in the semiconductor wafer, e.g., heavy metals and so forth, can be evaluated from this lifetime.

The most suitable optimal low-injection-state exposure condition from exposure condition detection circuit 11 should provide an injection density that is approximately $\leq 0.5$ times the carrier injection density at point A.

In the aforementioned first and second examples, a regulator 13 (one example of the regulatory means that interrupts and/or attenuates the excitation light) may be installed as depicted in FIG. 8 between the semiconductor wafer 2 and excitation light generator 4, thereby to function as an exposure condition controller 9 that is capable of varying the light pulse exposure conditions. This regulator 13 can be constituted of, for example, a filter, attenuator, lens, diffusor plate, optical shutter, or some combination thereof.

In addition, in the first and second examples, a regulator 13 can be installed as a separate element from the exposure condition controller 9.

In this case, the exposure conditions can be microcontrolled through an interruption and/or attenuation by regulator 13 of the emitted excitation light whose exposure condition has already been subject to variation by exposure condition controller 9. The conditions can thereby be set more precisely. Or, the task of varying the exposure conditions can be distributed over both the exposure condition controller 9 and regulator 13.

The detection accuracy of these devices $A_1$ and $A_2$ for measuring semiconductor properties at low injection states will be considered below.

Thus, even in the aforementioned first and second examples, the detection accuracy for the change in microwave level still declines as discussed above in the case of carrier injection into semiconductor wafer 2 at a low injection state.

In order to exceed the detection limit of devices $A_1$ and $A_2$ in light of this detection accuracy and realize a further reduction in injection, a beam size regulator 14 (one example of a beam-size-regulatory means) can be installed in order to make the beam size of the excitation light approximately equal to the area of the emitter tip of the microwave waveguide 3 (see FIG. 9). The reason for this is considered below.

When the illumination area $S_2$ by the excitation light is smaller than the area $S_1$ of the microwave emitter tip of waveguide 3, reflected microwave radiation is also detected from the range $\Delta S (=S_1-S_2)$ in which there is no excitation of excess minority carriers by the illumination of the surface of semiconductor wafer 2 by excitation light. When the contribution by this $\Delta S$ is relatively large compared to (or larger than) the contribution by the reflected microwaves in which excitation has produced a level change, the reflected microwaves travelling to the detector 6 are very noisy. The S/N ratio declines as a result and the device's detection accuracy is reduced.

Accordingly, the device's accuracy can be improved by approximately equalizing the two areas $S_1$ and $S_2$. Specific examples of the beam size regulator 14 are considered below.

Thus, as depicted in FIG. 9($a$), a beam size approximately equal to the area of the emitter end of the waveguide 3 can be obtained by focussing the excitation light by, for example, an optical lens 14' and then introducing it into the microwave waveguide 3, where the excitation light is irregularly reflected from the interior wall of the waveguide 3. In this example, the optical lens 14' and the waveguide 3 are equivalent to the beam-size-regulatory means.

As an alternative, as depicted in FIG. 9($b$), a beam size approximately equal to the area of the emitter tip of waveguide 3 can be produced by the introduction of the excitation light into the microwave waveguide 3 and diffusing it with diffusor plate 14''. In this example, the diffusor plate 14'' and the waveguide 3 are equivalent to the beam-size-regulatory means.

As another alternative, the emitter tip of the waveguide 3 can be contracted to agree with the beam size.

In addition, the functionalities in the preceding examples, e.g., the control circuit 8, estimation circuit 10 (10'), exposure condition detection circuit 11, and measurement circuit 12, can be centralized in and executed by one or more computers.

While the preceding examples concern measurement of the minority carrier change using reflected microwaves as the probe, any method that can sense a minority carrier increase/decrease can be used in the practical implementation, for example, an infrared laser, transmitted microwaves, and so forth.

As discussed hereinbefore, the present invention can estimate the dopant level in a semiconductor wafer and thereby estimate the critical value at which the carrier injection density in the semiconductor wafer reaches the high injection state. Moreover, by measuring the minority carrier lifetime at a low injection state adapted to this dopant level, the present invention can thereby afford the lifetime based on Shockley-Read-Hall statistics. Based on this, the impurity level in the semiconductor wafer, e.g., heavy metals and so forth, can be evaluated.

As a consequence, the present invention is highly qualified for the evaluation of semiconductor wafers.

Because the present invention's method and device for the evaluation of semiconductors wafers have the structures as discussed hereinbefore, the dopant level in the semiconductor wafer can be estimated and the critical value can thereby be estimated at which the carrier injection density in the semiconductor wafer reaches the high injection state. Moreover, by measuring the minority carrier lifetime at a low-injection-state exposure condition adapted to this dopant level, the present invention can provide the lifetime based on Shockley-Read-Hall statistics. Based on this, the impurity level in the semiconductor wafer, e.g., heavy metals and so forth, can be evaluated.

As a consequence, the present invention is highly qualified for the evaluation of semiconductor wafers.

We claim:

1. A method for determining a dopant level in semiconductor wafers, comprising the steps of:
   irradiating the semiconductor wafer with microwaves;
   exposing the semiconductor wafer to excitation light at varying exposure conditions;
   determining an amount of photoexcitation of the semiconductor wafer for the varying exposure conditions by measuring transmitted or reflected radiation of the microwaves irradiating the semiconductor wafer over a range of carrier injection densities;
   calculating a minority carrier lifetime which is approximately a minimum minority carrier lifetime for said range of carrier injection densities; and
   multiplying a carrier injection density of said approximately a minimum minority carrier lifetime by a value to determine the dopant level in the semiconductor wafer.

2. A method according to claim 1, wherein said multiplying step multiplies the carrier injection density of said approximately a minimum minority carrier lifetime by said value which corresponds to a relationship between said approximately a minimum minority carrier lifetime and the dopant value of the semiconductor wafer.

3. A method according to claim 1, wherein said multiplying step multiplies the carrier injection density of said approximately a minimum minority carrier lifetime by said value which is 0.8 to 20 and is a reciprocal of the carrier injection density of said approximately a minimum minority carrier lifetime divided by the dopant level.

4. A method according to claim 1, further comprising the step of:
   determining a relationship between a carrier injection density of a known dopant level of a standardizing semiconductor wafer and a carrier injection density at which the standardizing semiconductor wafer has approximately a minimum minority carrier lifetime to determine said value used by the multiplying step.

5. A method according to claim 1, wherein the step of calculating a minority carrier lifetime which is approximately a minimum minority carrier lifetime for said range of carrier injection densities is performed by determining a carrier injection density at which a lifetime thereof begins to increase as the carrier injection density is lowered.

6. An apparatus for determining a dopant level in semiconductor wafers, comprising:
   means for irradiating the semiconductor wafer with microwaves;
   means for exposing the semiconductor wafer to excitation light at varying exposure conditions;
   means for determining an amount of photoexcitation of the semiconductor wafer for the varying exposure conditions by measuring transmitted or reflected radiation of the microwaves irradiating the semiconductor wafer over a range of minority carrier injection densities;
   means for calculating a minority carrier lifetime which is approximately a minimum minority carrier lifetime for said range of carrier injection densities;
   means for multiplying a carrier injection density of said approximately a minimum minority carrier lifetime by a value to determine the dopant level in the semiconductor wafer.

7. An apparatus according to claim 6, wherein said means for multiplying multiplies the carrier injection density of said approximately a minimum minority carrier lifetime by said value which corresponds to a relationship between said approximately a minimum minority carrier lifetime and the dopant value of the semiconductor wafer.

8. An apparatus according to claim 6, wherein said means for multiplying multiplies the carrier injection density of said approximately a minimum minority carrier lifetime by said value which is 0.8 to 20 and is a reciprocal of the carrier injection density of said approximately a minimum minority carrier lifetime divided by the dopant level.

9. An apparatus according to claims 6,
   wherein said means for irradiating, said means for exposing, said means for determining and said means for calculating determine a relationship between a carrier injection density of a known dopant level of a standardizing semiconductor wafer and a carrier injection density at which the standardizing semiconductor wafer has approximately a minimum minority carrier lifetime to determine said value used by the multiplying step.

10. An apparatus according to claim 6, wherein the means for calculating a minority carrier lifetime which is approximately a minimum minority carrier lifetime for said range of carrier injection densities calculates said approximately a minimum minority carrier lifetime by determining a carrier injection density at which a lifetime thereof begins to increase as the carrier injection density is lowered.

11. An apparatus according to claim 6, further comprising:
   a regulation means disposed between the semiconductor wafer and the means for exposing which regulates said excitation light by at least one of interrupting and attenuating said excitation light.

12. An apparatus according to claim 6, further comprising:
   a beam-size regulator means for regulating a beam size of said excitation light to approximately equal an area of a microwave emitter tip of the means for irradiating.

* * * * *

UNITED STATES PATENT AND TRADEMARK OFFICE
CERTIFICATE OF CORRECTION

PATENT NO. : 5,430,386
DATED : July 4, 1995
INVENTOR(S) : Michel MORIN, et al.

It is certified that error appears in the above-indentified patent and that said Letters Patent is hereby corrected as shown below:

On the title page, Item [54] and Column 1, Lines 2-4, the title should read:

--METHOD AND APPARATUS FOR EVALUATING SEMICONDUCTOR WAFERS BY IRRADIATION WITH MICROWAVES AND EXCITATION LIGHT--

Signed and Sealed this

Tenth Day of October, 1995

Attest:

BRUCE LEHMAN

*Attesting Officer*  Commissioner of Patents and Trademarks